United States Patent [19]

Shih

[11] Patent Number: 5,398,641
[45] Date of Patent: Mar. 21, 1995

[54] METHOD FOR P-TYPE DOPING OF SEMICONDUCTOR STRUCTURES FORMED OF GROUP II AND GROUP VI ELEMENTS

[75] Inventor: Hung-Dah Shih, Plano, Tex.

[73] Assignee: Texas Instruments Incorporated, Dallas, Tex.

[21] Appl. No.: 98,492

[22] Filed: Jul. 27, 1993

[51] Int. Cl.$^6$ .......................................... H01L 21/203
[52] U.S. Cl. ..................... 117/101; 117/102; 437/105; 437/126; 437/133; 148/DIG. 64
[58] Field of Search ......................... 156/610, DIG. 72; 437/105, 126, 129, 133; 148/DIG. 64; 118/223 ME; 117/101, 102

[56] References Cited

U.S. PATENT DOCUMENTS

| | | | |
|---|---|---|---|
| 4,483,725 | 11/1984 | Chang | 437/126 |
| 4,735,910 | 4/1988 | Mitsuyu et al. | 437/105 |
| 4,833,101 | 5/1989 | Fujii | 437/126 |
| 5,079,185 | 1/1992 | Kagawa et al. | 437/133 |
| 5,081,632 | 1/1992 | Migita et al. | 372/45 |
| 5,248,631 | 9/1993 | Park et al. | 437/126 |
| 5,274,269 | 12/1993 | DePuydt et al. | 257/744 |
| 5,278,856 | 1/1994 | Migita et al. | 372/45 |

FOREIGN PATENT DOCUMENTS 0062982  5/1978  Japan ............. 118/723 ME

OTHER PUBLICATIONS

Koestner et al. in "Kinetics of MBE HgCdTe growth" J. Vac. Sci. Tech vol. A 6(4), Jul./Aug. 1988, pp. 2834–2839.

Boukerche et al. in "Doping of mercury cadmium telleride grown by MBE" J. Vac. Sci. Tech. vol. A 6(4), Jul./Aug., 1988, pp. 2830–2833.

*Primary Examiner*—R. Bruce Breneman
*Assistant Examiner*—Ramamohan Rao
*Attorney, Agent, or Firm*—Carlton H. Hoel; Richard A. Stoltz; Richard L. Donaldson

[57] ABSTRACT

A method and apparatus (10) for forming a p-doped layer (68, 80, 92) of Group II and Group VI elements by molecular beam epitaxial process in which a nitrogen dopant is introduced as the layer (68, 80, 92) is being grown. In one embodiment, molecular nitrogen is passed through a plasma generator (46) for converting it to activated nitrogen, and the activated nitrogen is conducted through an elongated guide tube (50) toward the substrate (66) upon which a Group II–Group VI layer (68, 80, 92) is being grown. In one embodiment, an n-type dopant source (72) is also provided, the apparatus (10) being operable for forming electrical devices (86, 88) having successive layers (78, 80, 90, 92, 94) of differing electrical characteristics.

14 Claims, 1 Drawing Sheet

METHOD FOR P-TYPE DOPING OF SEMICONDUCTOR STRUCTURES FORMED OF GROUP II AND GROUP VI ELEMENTS

"The U.S. Government has certain rights in this invention pursuant to contract No. DAAH01-91-C-R017."

FIELD OF THE INVENTION

This invention relates in general to the formation of p-doped semiconductor materials and, more particularly, to a method and apparatus for p-type doping and epitaxial growth of semiconductor structures formed of Group II–Group VI materials.

BACKGROUND OF THE INVENTION

Semiconductor structures having layers formed of Group II–VI compounds or alloys are of interest in the fabrication of infrared radiation detectors and imagers. For example, HgTe, and $Hg_{1-x}Cd_xTe$ are narrow band-gap Group II–Group VI semiconductors which may be utilized for emitting and absorbing infrared radiation in several regions of the infrared band. Such materials are often employed in the fabrication of infrared focal plane detector arrays, in which they serve as photodetectors, and in infrared light sources such as lasers, in which they serve as emitters. Since both the photodetector and radiation emitter devices require p-n junctions, p-type doping of at least one Group II–Group VI layer is necessary in each.

In certain applications, because of the necessity for tailoring such semiconductor structures with extremely sharp transitions between layers, the layers are advantageously formed by epitaxial growth processes. Molecular beam epitaxy (MBE) is an important technique utilized in the formation of device structures requiring very thin layers, such as double-layer heterojunction photodiodes, or two-color photodiodes, in which more than two active layers are required. In such device structures, molecular beam epitaxial growth processes have been employed for forming layers of both p-doped and n-doped Group II–Group VI materials.

MBE techniques are generally known in the art and have been widely discussed in the literature. See, for example, the following articles, which are hereby incorporated by reference: A. Y. Cho and J. R. Arthur, in *Progress in Solid State Chemistry*, edited by J. McCaldin and G. Somorjai (Pergamon, N.Y., 1975), Vol. 10, p. 157; L. L. Chang, in *Handbook on Semiconductors*, edited by S. P. Keller (North-Holland, Amsterdam, 1980), Vol. 3 Chapter 9; C. E. C. Wood, in *Physics of Thin Films*, edited by C. Haft and M. Francombe (Academic, N.Y., 1980), Vol. 11, p. 35; C. T. Foxon and B. A. Joyce, in *Current Topics in Materials Science*, edited by E. Kaldis (North-Holland, Amsterdam, 1981), Vol. 7, Chapter 1. Articles relating to p-type doping of Group II–Group VI layers during MBE growth include J. M. Arias, et al., J. Vac. Sci. Technology A8, pp. 1025–1033 (1990), which are also incorporated by reference.

As noted, molecular beam epitaxy provides a number of advantages in the formation of various semiconductor structures. In general, MBE processes permit the growth of thin films with extremely high crystalline quality. Normally in such MBE processes, neutral molecular or atomic species are directed onto a suitable substrate in a vacuum, the substrate being heated to a temperature sufficient to permit deposited atoms to move laterally for average distances of at least several angsttoms to permit the deposited atoms to find their energetically preferred sites. P-type doping of Group II–Group VI materials during epitaxial growth processes has been somewhat difficult, and it has been particularly difficult in the molecular beam epitaxial growth of mercury-containing layers, because of the high volatility of mercury. Accordingly, relatively low substrate temperatures, e.g., 185° C.–200° C., have been required. When it has been attempted to introduce a p-type dopant such as arsenic in association with the MBE growth of Group II–Group VI layers, particularly in the formation of $p-Hg_{1-x}Cd_xTe$, the MBE process has become further complicated, as will be discussed in the following section.

DESCRIPTION OF THE PRIOR ART

P-type doping of Group II–Group VI structures has, in the past, been accomplished either by intrinsic doping or by the introduction of Group V acceptor impurities, such as arsenic, into the structures, Such Group V elements result in p-type doping of Group II–Group VI materials because they occupy the Group VI lattice vacancies. Devices for which such MBE processes have been suggested in the past include n-on-p homojunction diode structures such as those having a structure comprising: (1) a CdZnTe substrate, (2) a $p-Hg_{1-x}Cd_xTe$ layer, wherein x=0.2, and (3) an $nHg_{1-y}Cd_yTe$ layer, wherein y=0.2. Other diode structures include a p-on-n double layer heterojunetion, having: (1) a CdZnTe (4% Zn) substrate, (2) an $n-Hg_{1-x}Cd_xTe$ (x=0.2) base layer, and (3) a $p-Hg_{1-y}Cd_yTe$ (y=0.3) cap layer. MBE processes are advantageously used particularly when the p-type cap layers must be very thin, e.g., 1.5 μm. However, in prior-art MBE processes such as those used for forming double layer heterojunction diodes, several limitations have been experienced. As will be understood by those in the art, such structures require precise vertical alignment of the p-n junction (e.g., the junction between the p-doped material and the n-doped material) with the heterojunction (the junction between the $Hg_{1-x}Cd_xTe$ layer and the $Hg_{1-y}Cd_yTe$ layer). In MBE growth of $Hg_{1-x}Cd_xTe$, n-type doping is typically accomplished by employing a dopant such elemental indium, in accordance with processes known in the art. However, processes for p-type doping of $Hg_{1-x}Cd_xTe$ during MBE growth have been less established.

In the past, arsenic, in the form of $As_4$, was used in p-type doping of CdTe during MBE growth at substrate temperatures of about 260°–300° C. However, arsenic activation in HgTe and in $Hg_{1-x}Cd_xTe$, which are often grown at 175°–200° C., has not been satisfactory because the arsenic is not sufficiently active at such low temperatures. Consequently, p-type doping of a device layer of MBE $Hg_{1-x}Cd_xTe$ has required a repetitious MBE growth process, accomplished by: (i) successive MBE growth of a plurality of thin CdTe/HgTe superlattice layer pairs, in which only the CdTe layer of each pair is doped with arsenic, and (ii) an annealing and interdiffusion process carded out at 350° C. or higher, after growth of the multiple CdTe and HgTe layer pairs, to form $p-Hg_{1-x}Cd_xTe$ by interdiffusion of the layers to homogenize arsenic in the resultant $Hg_{1-x}Cd_xTe$ structure. Such a diffusion process is effective only when the adjacent CdTe and HgTe layers are less than a few hundred angstroms, and the MBE deposition steps must thus be repeated many times, e.g., for 100 periods, to provide a p-doped structure of sufficient thickness for use in a typical diode or transistor. The process is thus tedious, time consuming, and costly.

Additionally, at the interface between an arsenic doped p-$Hg_{1-x}Cd_xTe$ layer and an n-doped layer, as in the above-described double layer heterojunction diode structure, it is difficult to align the p-n junction with respect to the heterojunction. That is, p-type doping and diffusion processes utilizing arsenic or other fast diffusing dopants affect the "vertical" alignment of the p-n junction with respect to the heterojunction, since such fast-diffusing dopants tend to diffuse through the heterojunction and into any adjacent layer. This junction misalignment or junction-positioning problem results in inferior device performance, since the arsenic may diffuse as much as 2 μm or more from the heterojunction into the adjacent layer. The handling of toxic substances such as arsenic is, of course, also of concern and entails additional safety-related procedures.

Arsenic in the form of a Group $II_3V_2$ compound of cadmium and arsenic, of which one example is $Cd_3As_2$, has been used for p-type doping of molecular beam epitaxial $Hg_{1-x}Cd_xTe$, as described in U.S. Pat. No. 5,028,561. In such a process, a flux is formed from a combination of a Group V dopant, and a Group II material. The Group II-V combination is applied with a Group VI element during molecular beam epitaxy growth of a Group II-VI substrate, wherein the dopant flux occupies and ties up the normal metal vacancies in the metal lattice, and acts as a p-type dopant. However, such processes entail the disadvantages discussed above with respect to junction misalignment when it is required to form precisely matched heterojunctions and n-p junctions in thin layers of Group II-Group VI materials, and they again entail the difficulties inherent in the use of such highly toxic substances. Thus, processes in which Group V dopants such as arsenic, lead, or phosphorus are incorporated in molecular beam epitaxial growth of II-VI materials have in general entailed a number of technical difficulties and disadvantages.

In contrast, nitrogen, also a Group V element, is a relatively slow diffuser and is non-toxic in its molecular form ($N_2$). In the past, however, nitrogen has not been considered acceptable as a p-type dopant for Group II-VI materials, for the following reasons. Molecular nitrogen is quite stable, having a triple co-valent bond, and its interatomic forces are very high. Because the nitrogen molecule is both very stable and highly symmetrical, intermolecular forces are very small at MBE growth temperatures. Whereas arsenic may be introduced in an epitaxial growth chamber in its inactive, molecular form, molecular nitrogen must be transformed into an active, atomic form if it is to react effectively with the Group VI lattice during epitaxial growth. Further, techniques utilized for the conversion of molecular nitrogen to its atomic form generally entail the use of a plasma source for activating the molecular nitrogen. When mercury is one of the epitaxial growth elements, it tends to vaporize at a high rate when heated during the MBE growth procedure. Thus, if a conventional MBE growth apparatus were used for the epitaxial growth of a mercury-containing layer, the mercury vapor would tend to enter and contaminate any components such as a plasma chamber utilized for forming activated nitrogen. Additionally, since the plasma is reactive, it could tend to etch the surfaces of the substrate, the nitrogen supply conduits, and other portions of the MBE apparatus, and to result in the introduction of impurities and residues tending to contaminate the chamber. For these and other reasons, activated nitrogen has not been considered acceptable as a dopant in such MBE processes and, indeed, the use of such a plasma source is unique, and contrary to the molecular epitaxial diffusion process, in that the other elements are being introduced as molecular fluxes derived from heated crucibles of the materials.

SUMMARY OF THE INVENTION

The present invention comprises a method and apparatus for epitaxial growth of a semiconductor structure having Group II and Group VI elements while effecting p-type doping of the semiconductor by the introduction of an activated nitrogen doping agent into the epitaxial layer. In one embodiment, the doping agent is introduced into the MBE chamber in the form of an activated nitrogen gas converted from molecular nitrogen by means of an electron cyclotron resonance apparatus connected between a source of molecular nitrogen gas and the interior of the MBE chamber. The electron cyclotron resonance apparatus is operable for directing a constant flow of highly activated nitrogen into the evacuated MBE chamber during epitaxial growth of one or more layers of a Group II-Group VI structure. The epitaxial growth of the p-type semiconductor layer is accomplished under a high vacuum, at molecular beam epitaxy pressures and temperatures appropriate for the MBE growth of the particular Group II and Group VI materials. The effective dopant deposition rates, and therefore, the doping intensity, are controlled by adjusting the flow rate of the nitrogen through the plasma source. Increased flow rates of activated nitrogen result in higher levels of p-type doping of the resultant layer, and lower levels of doping result from lower flow rates.

In the molecular beam epitaxial growth process, a substrate is supported within a MBE chamber evacuated to about $10^{-10}$ torr. The substrate has at least a surface region having one or more Group II materials, such as mercury and cadmium, or cadmium alone, and the substrate is positioned with its surface facing one or more effusion cells, the chamber also being in communication with the source of activated nitrogen.

In the formation of a HgCdTe layer, for example, if one Group II effusion cell contains mercury, another may contain cadmium. Or, a combination of two effusion cells having mercury and cadmium telluride, respectively, may be employed, along with the activated nitrogen source. A third cell, of tellurium, provides the Group VI element. Thus, an MBE flux is formed from a combination of activated nitrogen, a Group II material, and tellurium as the Group VI material, for the fabrication of a p-type $Hg_{1-x}Cd_xTe$ layer suitable for use in a narrow band-gap infrared photodetector device.

The flux is applied to the substrate during MBE growth at a pressure of about $1 \times 10^{-4}$ Torr to $4 \times 10^{-4}$ Torr. During MBE growth, the Group V material, i.e., the activated nitrogen, occupies and ties up vacancies in the Group VI lattice. Accordingly, the activated nitrogen dopant is permitted to diffuse into the Group VI lattice, the nitrogen undergoing an ongoing and continuous occupation of the Group VI lattice position, wherein it remains as a p-type dopant. The Group II component of the flux preferably dominates the Group VI element.

In accordance with other aspects of the invention, and as will be discussed hereinbelow, devices having various combinations of p-type and n-type layers may be formed by successive MBE depositions of n-doped a layers, as required for the fabrication of a particular photodiode or transistor structure. However, the necessity for multiple, successive depositions of CdTe/HgTe homogeneous pairs within each p-type layer, and subsequent annealing of the structure, is obviated.

The present invention thus entails several technical advantages over prior techniques employed for p-type doping of Group II–Group VI materials. These include the fact that the steps required to produce a p-doped II–VI structure are substantially fewer than those required in prior art methods employing multi-layer diffusion/annealing processes. Further, hetorojunctions are formed with precisely defined, matching n-p junctions, producing devices of high sensitivity to infrared radiation, and low levels of background signals emitted during "dark" conditions.

BRIEF DESCRIPTION OF THE DRAWING

Other aspects of the invention may be appreciated with reference to the following detailed description, taken in conjunction with the appended drawings in which.

DETAILED DESCRIPTION OF THE EMBODIMENTS

While the invention will be described with reference to an exemplary molecular beam epitaxy growth apparatus and with respect primarily to the formation of p-doped layers of particular Group II–Group VI materials, it should be understood that the invention is also applicable for use with other forms of molecular beam epitaxy apparatus and is also applicable in the formation of a variety of Group II–Group VI binary and three-layer semiconductor structures.

Figure 1:
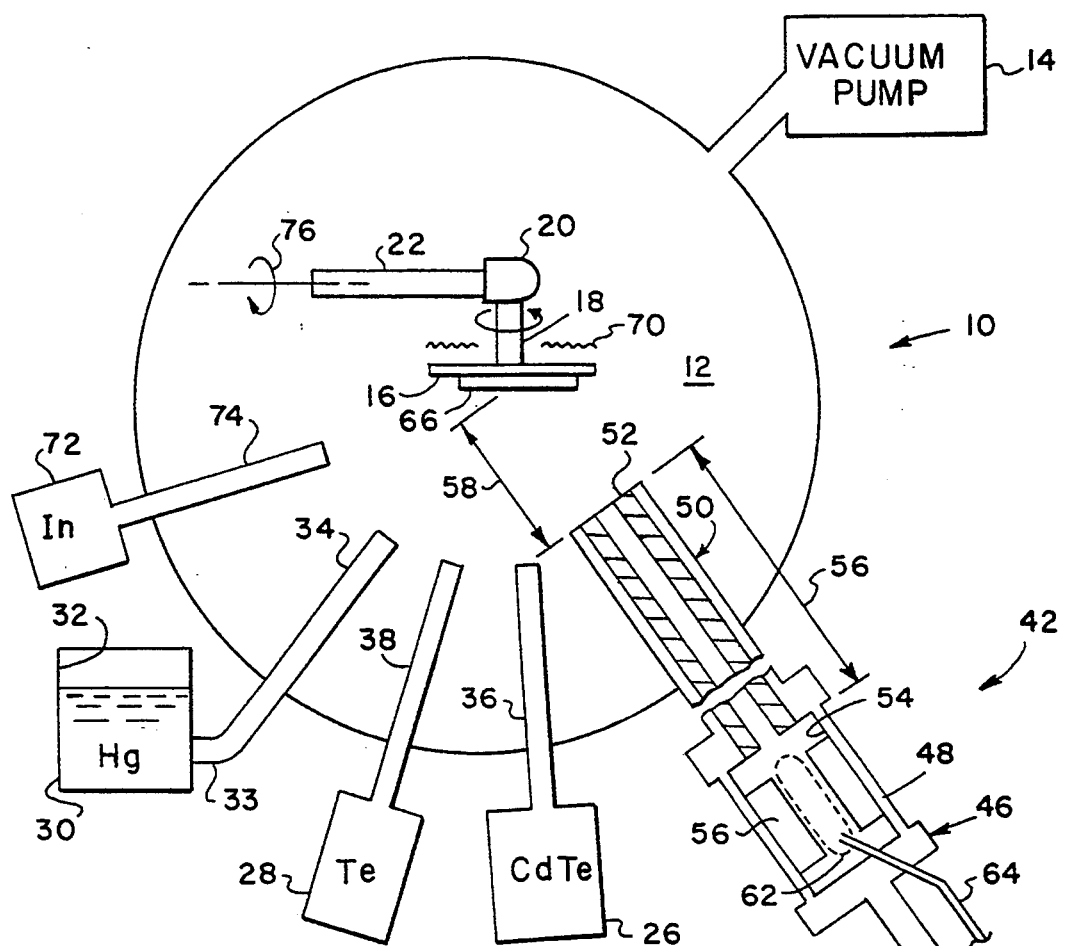
FIG. 1 is a schematic representation of an exemplary MBE system in accordance with the invention.

With initial reference to FIG. 1, an exemplary molecular beam epitaxial growth apparatus 10 in accordance with the present invention is shown, suitably including a commercially available MBE growth chamber such as the Riber Model 2300-P system, modified and configured in accordance with the present invention as will be described hereinbelow. The construction and operation of such MBE apparatus is generally known by those in the art, e.g., as disclosed in U.S. Pat. Nos. 4,605,469 and 4,622,083, which are hereby incorporated by reference. Accordingly, the details of construction of the MBE apparatus will not be described in detail herein.

In summary, the apparatus 10 defines a growth chamber 12 which is adapted to be evacuated to ultra-low pressures by a high vacuum pump 14. A substrate holder suitably including a molybdenum support plate 16 is positionable centrally within the chamber 12 on a rotatable shaft 18 which is connected to and extends perpendicularly from the back surface of the support plate. The shaft 18 is axially rotatable by means of drive means, such drive means being known to those in the art, and figuratively represented at 20, the drive means and shaft 18 being supported on a positioning member 22 which is axially rotatable for diverting the support plate 16.

The MBE apparatus 10 is operable for epitaxially growing p-doped layers of various Group II–Group VI semiconductor alloys and compounds. Representative Group II–Group VI structures which are successfully grown and p-doped in accordance with the invention include cadmium telluride, mercury telluride, and $Hg_{1-x}Cd_xTe$. Other suitable Group II–Group VI materials include CdSe, HgSe, HgCdSe, PbTe, and PbSe. Mercury-containing layers are advantageously utilized in the fabrication of narrow bandgap infrared detectors and emitters, and the method and apparatus of the present invention are adapted for forming p-doped mercury-containing layers, and various combinations of heterojunction structures, in which the devices are formed with extremely precise p/n junctions, with little diffusion of the Group V dopant into any adjacent layer. As will be understood from the description to follow, the growth and concurrent p-doping of an entire Group II–Group VI layer is accomplished during a single, continuous epitaxial growth procedure, in contrast to the multiple deposition and diffusion/annealing steps employed in previous methods. With reference to FIG. 1, exemplary embodiments of the process and method of the present invention will now be described in which a layer of $p-Hg_{1-x}Cd_xTe$, of sufficient thickness for use in an infrared-sensitive photodiode or the like is epitaxially grown while an activated nitrogen dopant is simultaneously introduced into the epilayer for doping the $Hg_{1-x}Cd_xTe$.

The apparatus 10 includes a plurality of flux sources provided in one or more effusion cells communicating with the MBE chamber 12. In accordance with practices known in the art, the effusion cells include crucibles containing respective elements or combinations of elements selected for MBE deposition of a particular structure and are individually heated by electrical power from a power source, not shown, to produce vapor fluxes from their respective materials. In operation, the fluxes are directed into the MBE chamber 12 and toward substrate support plate 16 and any substrate mounted thereon. Whereas the number and contents of the effusion cells vary in accordance with the particular materials being grown, in the present, illustrative embodiment in which $Hg_{1-x}Cd_xTe$ is to be formed, a first effusion cell 26 of a CdTe compound, and a second effusion cell 28 of tellurium, are employed. A mercury cell 30 is also provided, in which liquid mercury substantially fills a chamber 32, which is connected by means of tubing 33 and guide tube 34 to the interior of the MBE chamber 12. The CdTe and Te effusion cells 26, 28 are in communication through respective guide tubes 36, 38 with the MBE chamber 12, the guide tubes being directioned centrally or toward the molybdenum support plate 16, and any substrate thereon.

Further in accordance with the present invention, a nitrogen injection apparatus 42 is provided for introducing activated nitrogen into the MBE chamber 12 during epitaxial growth of a Group II–Group V layer. Nitrogen injection apparatus 42 is operable for directioning a stream or jet of activated nitrogen along a constrained, substantially linear path toward any substrate supported on the molybdenum support plate 16. The nitrogen injection apparatus 42 includes an ionization means for converting molecular nitrogen ($N_2$), received from molecular nitrogen source 44, into activated, atomic nitrogen for injection into the MBE chamber 12. The molecular nitrogen contained in source 44 is extremely pure. For example, nitrogen of 99.9999 percent purity has been successfully employed. In the preferred embodiment, the nitrogen injection apparatus 42 includes an electron cyclotron resonance (ECR) plasma source 46, such as those manufactured by Wavemat. The ECR plasma source 46 includes an elongated, generally tubular housing 48 having an inlet end connected for receiving the molecular nitrogen 44 and an outlet or downstream end connected to an elongated guide tube 50. The elongated guide tube 50 is preferably quartz-lined, as shown at 52, and is connected between plasma chamber 54 defined within the ECR housing 48, and the MBE chamber 12. The guide tube 50 is preferably directioned toward the molybdenum support plate 16. Preferably, the robe 50 is sufficiently long that it extends within the MBE chamber 12 for a substantial distance toward the substrate, wherein the spacing 56 between the electron cyclotron resonance device housing 48 and the distal end of the guide tube 50 is greater than the distance, indicated at 58, between the support plate 16 and the distal end portion of the guide tube 50. Preferably, the length of the elongated guide tube 50 is twice that of the spacing 58 between the distal end portion thereof and the substrate support plate 16. Further, the inner diameter of the quartz lining 52 is small relative to the length 56 of the tube 50, whereby the nitrogen is injected as a narrow stream, and wherein its angle of dispersion is quite small. The elongated, quartz-lined guide tube 50 thus provides several technical advantages in the operation of the system. The relatively small inner diameter of the quartz lining 52, e.g., suitably of about 1⅜ inches, in combination with the extended length of the tube 50, e.g., of about 8 to 15 inches, serves to direction the activated nitrogen toward the support plate 16 and, further, to minimize any influx of mercury vapor from the chamber 12 into the plasma chamber 54 during the MBE deposition procedures. It has not been previously recognized that the length of such a guide tube is of any criticality, or that the angle of dispersion of a p-type dopant is of importance in permitting the use of an activated nitrogen dopant in such MBE processes, as will be more fully discussed hereinbelow.

The electron cyclotron resonance housing 48 is connected via a control valve 60 to the nitrogen source 44. When energized, such ECR plasma generators create a concentrated magnetic field, indicated at 62, for plasma confinement, and a microwave power supply input device 64 is provided through which microwave energy, e.g., suitably at 2.45 megahertz, is introduced into the plasma chamber. Such devices serve to provide a magnetic field in which the modulus of the magnetic field 62 is minimal near the center of the chamber 54, wherein the Larmor frequency of the electrons defined by the magnetic field equals the frequency of the injected microwaves. Electrons crossing the field are thus energized by the electron cyclotron resonance. Accordingly, although molecular nitrogen ($N_2$) is in general very unreactive, because of the strong triple bond between the $N_2$ atoms, when activated by such a plasma source, substantially all of the nitrogen is converted to activated, atomic nitrogen, which is highly reactive. The use of such an electron-cyclotron-resonance plasma source is preferred over other plasma source devices because of its efficiency and its capability of operation at very low pressures, of about $1 \times 10^{-4}$ or $10^{-5}$ Torr, which are compatible with those within the MBE chamber 12. However, other plasma sources, such as those of the radical-beam type, may also be employed. During MBE growth process, the relatively long, quartz-lined guide tube 50 buffers the plasma source 46, whereby the plasma chamber 54 is distanced and substantially isolated from the MBE chamber 12, thereby minimizing mercury absorption within the plasma chamber 54.

Figure 2:
FIG. 2 is a schematic cross-sectional view of a structure formed by the method and apparatus of the present invention.

To summarize the operation of the ECR plasma source 46 during the molecular beam epitaxial growth process, the ECR plasma source 46 is initially activated, and valve 60 is opened to permit high purity nitrogen ($N_2$) gas to pass through the valve and the ECR plasma chamber 54 to form activated nitrogen, comprising mostly atomic nitrogen, which is directed through the quartz liner of guide tube 50 toward a crystalline substrate 66 mounted on the substrate support plate 16 during epitaxial growth of a Group II-Group VI layer, for effecting p-type doping of the epitaxial layer being grown on the substrate. As seen in FIG. 2, the p-type Group II-Group VI layer 68 is thereby grown on the outer surface of substrate 66. The doping level is controlled by adjustments of the nitrogen pressure and flow rates, by adjusting valve 60. During the MBE growth process, the substrate support plate 16 and substrate 66 are preferably rotated by shaft 18 at a constant speed, whereby the substrate is evenly heated by radiation from non-rotating heater element 70. As stated above, the MBE growth of such Group II-Group VI materials is known in the art, e.g., as discussed in the article of R. J. Koestner and H. F. Schaake, Journal Vac. Sci. Technology, A6, p.2834 (1988), which is hereby incorporated by reference. In one embodiment, to be described in further detail, in a later section, an additional effusion source 72 and guide tube 74 are provided for emitting an n-type dopant, such as indium, into the MBE chamber 12 prior to, or subsequent to, the formation of the p-type layer, for forming two layer or three layer devices.

The method of the present invention will now be described with respect to the formation of a p-HgCdTe layer 68, as illustrated in FIG. 2. Initially, a compatible crystalline substrate 66 (FIG. 2) is mounted on the support plate 16. For example, in the formation of $Hg_{1-x}Cd_xTe$, substrates formed of CdZnTe<100>, CdZnTe<211>-Te, and CdZnTe<111>-Te are suitable. A four percent zinc component is included for lattice matching. Suitably, a CdZnTe substrate 66, of approximately 500 μm thickness, is mounted on the support plate 16 by means of a gallium soldering process, in accordance with methods well known in the art. For convenience, the substrate 66 and support plate 16 may be initially loaded in a loading chamber (not shown) positioned to one side of the MBE vacuum chamber 12, as described in U.S. Pat. No. 4,605,469, previously incorporated by reference. The loading chamber is then evacuated and the substrate 66 and support plate 16 are subsequently transferred to the evacuated MBE chamber 12 by means of a substrate transfer mechanism, not shown, as also disclosed in U.S. Pat. No. 4,605,469.

The MBE chamber is initially baked to remove impurities and oxides from the interior surfaces of the chamber 12 and from the guide tubes 50, 36, 38, 34, and 74. The MBE chamber 12 is evacuated to a pressure of approximately $10^{-10}$ Torr by means of high vacuum pump 14. Next, the CdTe, Te, and Hg cells are heated to their respective operating temperatures. During the initial heating of the CdTe and tellurium cells, their respective shutters are closed. Additionally, there is initially no mercury in the mercury cell, whereby the MBE chamber 12 remains free of fluxes of the epitaxial materials.

The substrate/support plate assembly 16 is then transferred into the MBE growth chamber 12, power is applied to heating element 70, and rotation of the substrate support plate 16 on shaft 18 is initiated as the substrate 66 is heated to about 300° C. by the heating element 70 to remove oxide from the CdZnTe substrate 66. The support plate 16 and CdZnTe substrate 66 are then permitted to cool to a growth temperature of approximately 180° C. During this initial 300° C. baking procedure, the support plate 16 is diverted downwardly, i.e., the positioning member 22 is rotated axially in the direction shown by arrow 76, whereby the substrate front surface is preferably deviated downwardly from the generally horizontal plane in which guide tubes 36, 38, 34, 50, and 74 are aligned, whereby any contaminants in the chamber 12 are not permitted to fall upon the surface of the substrate 66. When the substrate 66 reaches the desired growth temperature, e.g., 180° C., control valve 60 is opened to permit nitrogen gas to flow from source 44 through the ECR plasma source 46, and through the elongated, quartz lined guide tube 50 into the MBE growth chamber 12. The nitrogen pressure in the growth chamber is adjusted by adjusting the rate of flow of the nitrogen with respect to the pumping rate of the vacuum pump 14. Adjustments in the flow rate are suitably made by performing tests, prior to the epitaxial growth of a p-doped layer, for measuring the pressure increase after the valve 60 is opened. As suggested above, the vacuum within the chamber is initially about $10^{-9}$ Torr, and, typically, rises to about $3-4 \times 10^{-5}$ Torr during injection of the nitrogen. During the initial pressure adjustment phase, the ECR plasma source is not activated.

Upon the substrate 66 reaching a desired epitaxial growth temperature and the rate of nitrogen flow being adjusted, positioning member 22 is axially rotated to bring the substrate 66 into alignment with the guide tubes 34, 36, 38, 50 and 74. Next, mercury is allowed to enter the MBE growth chamber 12 by adjustment of a valve, not shown, in line 33, or by other suitable flow control means. When the mercury flux has been adjusted, the CdTe and tellurium effusion cell shutters are opened, and the electron cyclotron resonance plasma source apparatus 46 is turned on for generating the plasma which activates the flow of nitrogen. At this stage, mercury, tellurium, and CdTe fluxes are continuously applied to the substrate in association with the activated nitrogen, effecting the epitaxial growth and nitrogen doping of p-$Hg_{1-x}Cd_xTe$. The MBE chamber 12 is maintained at a pressure of approximately $10^{-4}$ Torr during this growth process, and deposition rates of approximately 2 $\mu$m per hour are typically attained. The resultant structure is illustrated in FIG. 2, wherein the CdZnTe substrate 66 is mounted on the substrate support plate 16 beneath the p-$H_{1-x}Cd_xTe$ layer 58, and wherein x is 0.3.

After several repeated runs, mercury will become absorbed on the wall of the MBE growth chamber 12. Accordingly, when an excess of mercury has accumulated, e.g., after several runs, or on a weekly basis, the chamber is heated to a temperature of about 100° C., and the absorbed mercury is vaporized and transferred to a Hg-collecting chamber, not shown. During this baking procedure, the ECR plasma generator 46 is protected from mercury adsorption by baking it at a temperature of approximately 100° C., suitably by means of resistive heating tapes wrapped around the guide tube 50 and ECR apparatus 46.

The electrical properties of the p-$Hg_{1-x}Cd_xTe$ layer 68 are suitably characterized by Hall measurements. Typically, the p-type doping levels in p-$Hg_{1-x}Cd_xTe$ (x=0.3), and in other mercury compounds such as HgTe and $Hg_{1-x}Cd_xTe$ (x=0.28), are in the mid-$10^{18}/cm^3$ range. As suggested above, the process is also adapted for use in the growth of other Group II–Group VI materials. The p-doping levels in MBE grown CdTe, for example, are typically in the low-$10^{19}/cm^3$ range, with room temperature Hall mobilities as high as 130 $cm^2/V.sec$.

Figure 3:
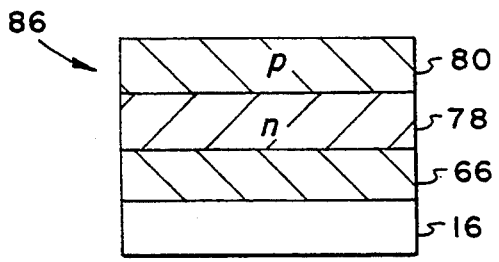
FIG. 3 is a schematic cross-sectional view of a photodetector device formed by the method and apparatus of the present invention.

The structure illustrated in FIG. 2 is typically utilized as a test structure for verifying and adjusting the apparatus 10. Referring now to FIG. 3, the process is also advantageously employed for forming binary or diode devices 86 having p/n junctions. In such a process, an intermediate, n-$Hg_{1-y}Cd_yTe$ layer 78 is initially formed over the CdZnTe substrate 66 prior to the formation of a p-doped $Hg_{1-x}Cd_xTe$ layer 80, in accordance with the method discussed above. The MBE growth of n-doped Group II–Group VI layers is accomplished by the above-described MBE apparatus 10 and growth procedure, except that indium cell 72, rather than the nitrogen injection apparatus 42, is activated during the process of growing the n-type layer 78. Thus, an indium dopant is incorporated into layer 78 during its growth, resulting in n-type dopant characteristics in the resultant n-$Hg_{1-y}Cd_yTe$ (y=0.2) layer 78, after which p-doped layer 80 is grown on the n-type layer utilizing the nitrogen injection apparatus 42 as discussed above. Thus, a p-n diode structure 86 is formed, as shown in FIG. 3. The use of indium as an n-type dopant for HgCdTe during MBE processes for forming Group II–Group VI structures is known in the art (see, e.g., J. M. Arias, et al., J. Vac. Sci. Technol. A8, pp. 1025–1033 (1990)), and will not be described in detail herein. However, it has not been previously recognized that Group II–Group VI device structures may be epitaxially grown in an MBE chamber in an ongoing process wherein the dopant characteristic may be changed from n-type to p-type by closing the shutter of an effusion cell of n-type dopant and energizing an ECR plasma generator or other plasma source for injecting an activated nitrogen p-type dopant, continuing the growth procedure without removing the substrate from the MBE chamber 12.

Figure 4:
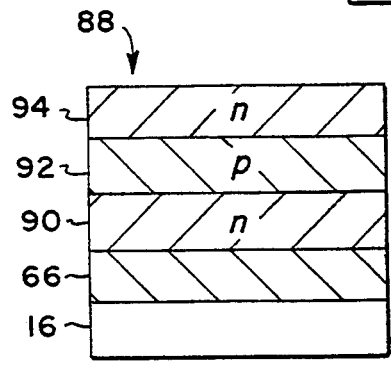
FIG. 4 is a schematic cross-sectional view of a three-layer device formed by the method and apparatus of the invention.

The apparatus 10 is thus readily adapted for forming a variety of devices, with electrical characteristics corresponding to respective device specifications. For example, and with reference now to FIG. 4, an n-p-n trilayer device 88 is conveniently formed by the apparatus 10. The n-p-n transistor device 88 suitably includes a base n-type layer, similar to n-type layer 78 of FIG. 3, an intermediate p-doped layer 92, similar to p-type layers 80 of FIG. 3 and 68 of FIG. 2, and an upper, n-doped layer 94 similar to layers 90 and 78. The three layer device structure 88 is formed in accordance with the process described above with respect to the formation of the two-layer device 86 of FIG. 3, followed by an additional MBE deposition step in which the nitrogen injection apparatus 42 is shut off, valve 60 being closed, and the shutter of indium effusion cell 72 is opened, cells 26, 28 and 30 also remaining open. Again, the device structure 88 is formed during a continuous MBE growth process without vacuum release or removal of substrate 66 from MBE chamber 12.

It may now be understood that the process and apparatus of the present invention afford significant technical advantages over prior-art methods and apparatus. By the use of an activated nitrogen dopant in association with the MBE growth of a Group II–Group VI layer, the problems inherent in prior-art doping systems employing fast diffuser elements such as arsenic are substantially eliminated, since the nitrogen atom is a very slow diffuser in such materials. That is, because the nitrogen atom does not diffuse rapidly, the nitrogen dopant effused into the chamber 12 and the Group II–Group VI layer does not tend to diffuse into any adjacent n-doped layer, and, accordingly, precise heterojunctions between adjacent p-type and n-type layers are achieved, thereby greatly enhancing the performance of photodiodes constructed in accordance with the present method.

A further technical advantage of the invention with respect to prior-art processes in which fast diffusing dopants such as arsenic are used is that the requirement for successive deposition and annealing procedures with respect to multiple pairs of doped and undoped layer pairs, and subsequent annealing of the structure, is eliminated, in that the process of the present invention is adapted for growing p-doped Group II–Group VI layers in a continuous, uninterrupted process, and in any desired thickness.

Additionally, the use of nitrogen as a dopant entails the further advantage that it is substantially less toxic than arsine or its derivatives. Further technical advantages are entailed in the utilization and construction of the plasma source, and the elongated guide tube employed for directing the activated nitrogen in a narrow beam toward the CdTe substrate and for minimizing any return influx of mercury or other volatile elements from the MBE chamber. Thus, such elements are substantially prevented from entering and depositing on the interior of the plasma source, thereby obviating the need for frequent and time consuming bakeouts of the plasma source, e.g., bakeouts after each deposition, thus greatly increasing the throughput of the apparatus 10. As discussed, it will now be apparent to those in the art that various combinations of elements may be used, and that various device structures, including two-layer and three-layer device structures, may readily be formed using the process and apparatus of the present invention. It will further be apparent that because of the precisely controllable MBE growth processes, layers of precise and differing thicknesses may be readily formed.

While the invention has been described with reference to illustrative embodiments, this description is not intended to be construed in a limiting sense. Various modifications and combinations of the illustrative embodiments, as well as other embodiments of the invention, will be apparent to persons skilled in the art upon reference to this description. It is therefore intended that the appended claims encompass any such modifications or embodiments.

What is claimed is:

1. A method for forming a p-doped semiconductor layer, comprising the steps of:
   providing a crystalline substrate;
   supporting the substrate within a chamber;
   epitaxially growing on the substrate a semiconductor layer consisting essentially of Group II and Group VI materials with mercury included in the Group II material, while introducing activated nitrogen into the chamber to effect p-type doping of the semiconductor layer.

2. The method of claim 1, wherein the step of epitaxially growing a semiconductor layer comprises introducing a flux of Group VI materials selected from one or more of the group consisting of tellurium and selenium.

3. The method of claim 1, wherein the step of epitaxially growing a semiconductor layer on the substrate while introducing activated nitrogen into the chamber comprises the steps of:
   providing a source of nitrogen in molecular form:
   providing a plasma source connected between the source of molecular nitrogen and the chamber and causing the nitrogen to flow through the plasma source for activating the molecular nitrogen; and
   injecting the activated nitrogen into the chamber.

4. The method of claim 3, wherein the plasma source communicates with the chamber through a buffering means for isolating the plasma source from the chamber, the buffering means defining a channel, and wherein the step of injecting activated nitrogen comprises injecting activated nitrogen into the chamber through the channel.

5. The method of claim 4, wherein the buffering means comprises a guide tube which projects within the chamber, and wherein the step of injecting activated nitrogen into the chamber comprises passing the nitrogen through the guide tube for a distance which is greater than the distance between the guide tube and the substrate.

6. The method of claim 1, further comprising epitaxially growing another semiconductor layer on the substrate while effecting in-situ n-type doping of said another semiconductor layer.

7. A method for forming a semiconductor device, comprising the steps of:
   providing a crystalline substrate;
   supporting the substrate within a chamber;
   epitaxially growing a first, n-doped semiconductor layer on the substrate;
   epitaxially growing a second semiconductor layer on the first layer, the second layer consisting of at least one Group II element and including mercury and at least one Group VI element selected from the group consisting of tellurium and selenium; and
   introducing activated nitrogen into the chamber, during the step of epitaxially growing the second layer and effect p-type doping of the second layer.

8. The method of claim 7, wherein the step of epitaxially growing the first semiconductor layer comprises introducing a flux consisting essentially of the Group II and Group VI materials of the second layer while introducing a flux of an n-type dopant.

9. The method of claim 6, further comprising:
   epitaxially growing a third, n-doped semiconductor layer on the second, p-doped semiconductor layer.

10. A method for epitaxially growing a p-type semiconductor layer consisting essentially of Group II and Group VI materials, comprising the steps of:
    providing a crystalline substrate;
    supporting the substrate within a molecular beam epitaxy chamber;
    growing a semiconductor layer on the substrate by molecular beam epitaxy, by introducing flux into the chamber consisting essentially of at least one Group II element and including mercury and at least one Group VI element selected from the group consisting of tellurium and selenium; and introducing activated nitrogen into the chamber, during the step of epitaxially growing a semiconductor layer to effect in-situ p-type doping of the semiconductor layer.

11. The method of claim 10, wherein the at least one Group II element comprises mercury and cadmium.

12. The method of claim 11, wherein the at least one Group VI element comprises tellurium.

13. The method of claim 12, wherein the step of introducing activated nitrogen into the chamber comprises the steps of:

providing a source of molecular nitrogen and providing activating means connected between the molecular nitrogen source and the chamber;

activating the molecular nitrogen by causing it to flow through the activating means;

causing activated nitrogen to flow from the activating means to the chamber along a passageway directioned toward the substrate.

14. The method of claim 13, wherein the activating means comprises an electron cyclotron resonance means for generating a resonant magnetic field, and wherein the step of activating the molecular nitrogen comprises causing the molecular nitrogen to flow through the magnetic field.

* * * * *